(12) United States Patent
Duddy et al.

(10) Patent No.: US 6,449,844 B2
(45) Date of Patent: Sep. 17, 2002

(54) HEAT EXCHANGER APPARATUS FOR A SEMICONDUCTOR WAFER SUPPORT AND METHOD OF FABRICATING SAME

(75) Inventors: Thomas M. Duddy, Foster City, CA (US); Robin M. Ellis, San Bruno, CA (US); Craig A. Bercaw, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/730,872

(22) Filed: Dec. 5, 2000

(Under 37 CFR 1.47)

Related U.S. Application Data

(62) Division of application No. 09/175,143, filed on Oct. 19, 1998, now Pat. No. 6,180,926.

(51) Int. Cl.[7] .................................................. B23P 15/26
(52) U.S. Cl. ............................... 29/890.03; 29/890.043
(58) Field of Search ....................... 29/890.03, 890.043, 29/447

(56) References Cited

U.S. PATENT DOCUMENTS

| | | | | |
|---|---|---|---|---|
| 2,179,934 A | * | 11/1939 | Jones | 219/538 |
| 2,255,500 A | * | 9/1941 | Blaha | 219/468.2 |
| 2,799,765 A | * | 7/1957 | Jenkins et al. | 219/468.1 |
| 3,110,795 A | * | 11/1963 | Bremer | 219/468.1 |
| 4,842,683 A | | 6/1989 | Cheng et al. | 156/345 |
| 4,980,960 A | * | 1/1991 | Usui et al. | 29/447 |
| 5,152,048 A | * | 10/1992 | Brückner et al. | 29/447 |
| 5,199,483 A | | 4/1993 | Bahng | 165/1 |
| 5,228,501 A | | 7/1993 | Tepman et al. | 165/80.1 |
| 5,350,427 A | | 9/1994 | Freytsis et al. | 29/25.01 |
| 5,656,093 A | | 8/1997 | Burkhart et al. | 118/728 |
| 5,034,688 A | * | 11/1999 | Moulene et al. | 219/444.1 |
| 5,977,519 A | * | 11/1999 | Sorensen et al. | 118/728 |

* cited by examiner

Primary Examiner—I Cuda Rosenbaum
(74) Attorney, Agent, or Firm—Moser, Patterson & Sheridan LLP

(57) ABSTRACT

A heat exchanger apparatus including a heat exchange element and a substrate support. A clamp member is coupled to the heat exchange element and the substrate support by expanding the clamp member to an expanded state sufficient to surround a portion of the substrate support and the heat exchange element, and contracting the clamp member to couple the clamp member to the substrate support.

8 Claims, 5 Drawing Sheets

HEAT EXCHANGER APPARATUS FOR A SEMICONDUCTOR WAFER SUPPORT AND METHOD OF FABRICATING SAME

CROSS-REFERENCE TO RELATED APPLICATIONS

This application is a divisional of U.S. Ser. No. 09/175,143, filed Oct. 19, 1998, now U.S. Pat. No. 6,180,926 entitled HEAT EXCHANGER APPARATUS FOR A SEMICONDUCTOR WAFER SUPPORT AND METHOD OF FABRICATING SAME, assigned to the same assignee as the present application, which application is hereby incorporated by reference in its entirety.

BACKGROUND OF THE INVENTION

1. Field of the Invention

The invention relates to wafer temperature control apparatus for semiconductor wafer processing systems and, more specifically, the invention relates to a heat exchanger apparatus for a semiconductor wafer support in a semiconductor processing system that maintains the wafer at a substantially constant temperature during processing of the wafer.

2. Description of the Related Art

Semiconductor wafer temperature control apparatus is useful in a variety of applications, particularly in the manufacturing of semiconductor devices using processes that require the wafers to be maintained at stable temperatures. In particular, a resistive heater may be utilized in, for example, chemical vapor deposition (CVD) processing chambers to heat a wafer during processing and maintain the wafer at an elevated temperature to facilitate film deposition.

Typically, a heater assembly is a portion of a semiconductor wafer support (known as a susceptor) and is comprised of a platen that is fabricated of aluminum or other thermally conductive material with a top surface having a generally circular shape for supporting a semiconductor wafer within a process chamber. The wafer support also includes a shaft which is coupled to the bottom of the platen and supports the platen in the process chamber. A heating element is mounted in or under the platen and is arranged to be in thermally conductive contact with the surface of the platen such that a wafer supported by the platen can be heated during processing.

One manufacturing technique for a heater assembly is a cast-in method wherein the heating element is cast-into the platen as the platen is formed, i.e., a resistive heating element is inserted into molten platen material (aluminum) during the platen manufacturing process. To accomplish the insertion of the heating element into the molten platen material without melting the heating element, the melting point of the heating element must be substantially higher than the melting point of the platen material. This means that if stainless steel or aluminum are used as the heating element, the types of materials which may be used for the platen are limited.

Another manufacturing technique for a heater assembly is a machined platen manufacturing technique wherein the heating element is placed in a channel that is milled into the bottom surface of the platen. The channel is filled with a high temperature epoxy and a cover plate is then secured (welded) over the channel to seal the heating element and epoxy into the platen. Unfortunately, the high temperature epoxy has a limited life expectancy over which it sufficiently supports the heating element and provides good thermal conductivity to the platen. Over time, the epoxy breaks down and ceases to be a good thermal conductor. As such, the useful life of a platen is limited by the useful life of the heater element and its mounting structure.

Therefore, there is a need in the art for an improved temperature control apparatus that provides effective thermal conductivity between a platen and a heat exchange element (e.g., a heating element) without the use of epoxy or without strict limits on the materials used to fabricate the platen and heat exchange element.

SUMMARY OF THE INVENTION

The invention comprises a heat exchanger apparatus including a heat exchange element coupled to a substrate support. To retain the heat exchange element within the substrate support, a clamp member is coupled to both the heat exchange element and the substrate support. To assemble the heat exchanger apparatus, a thermal differential is created between the clamp member and the substrate support such that the clamp member is enlarged to circumscribe the substrate support. Illustratively, the clamp member is heated to expand it to an enlarged state sufficient to surround the substrate support and the heat exchange element, and then the clamp member is cooled to couple the clamp member to the substrate support.

In an alternative embodiment, the substrate support comprises a platen, being substantially cylindrical, with a substantially flat wafer support surface and a bottom surface. The bottom surface contains a channel into which a heat exchange element is inserted and clamped, as discussed above, using a clamp member. In this embodiment, a corkscrew channel is formed about the outer surface of the cylindrical platen. A seal member, being a substantially cylindrical ring, is heated to expand the ring, the ring is positioned about the corkscrew channel and then the ring is cooled to affix the seal member about the corkscrew channel. The seal member in combination with the corkscrew channel forms a corkscrew conduit. The clamp member is fitted over the seal member to retain the heat exchange element in the platen as discussed above. The corkscrew conduit is useful for providing an inert gas, having a temperature defined by the temperature of the platen, to the backside of the wafer located on the wafer support surface of the platen.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
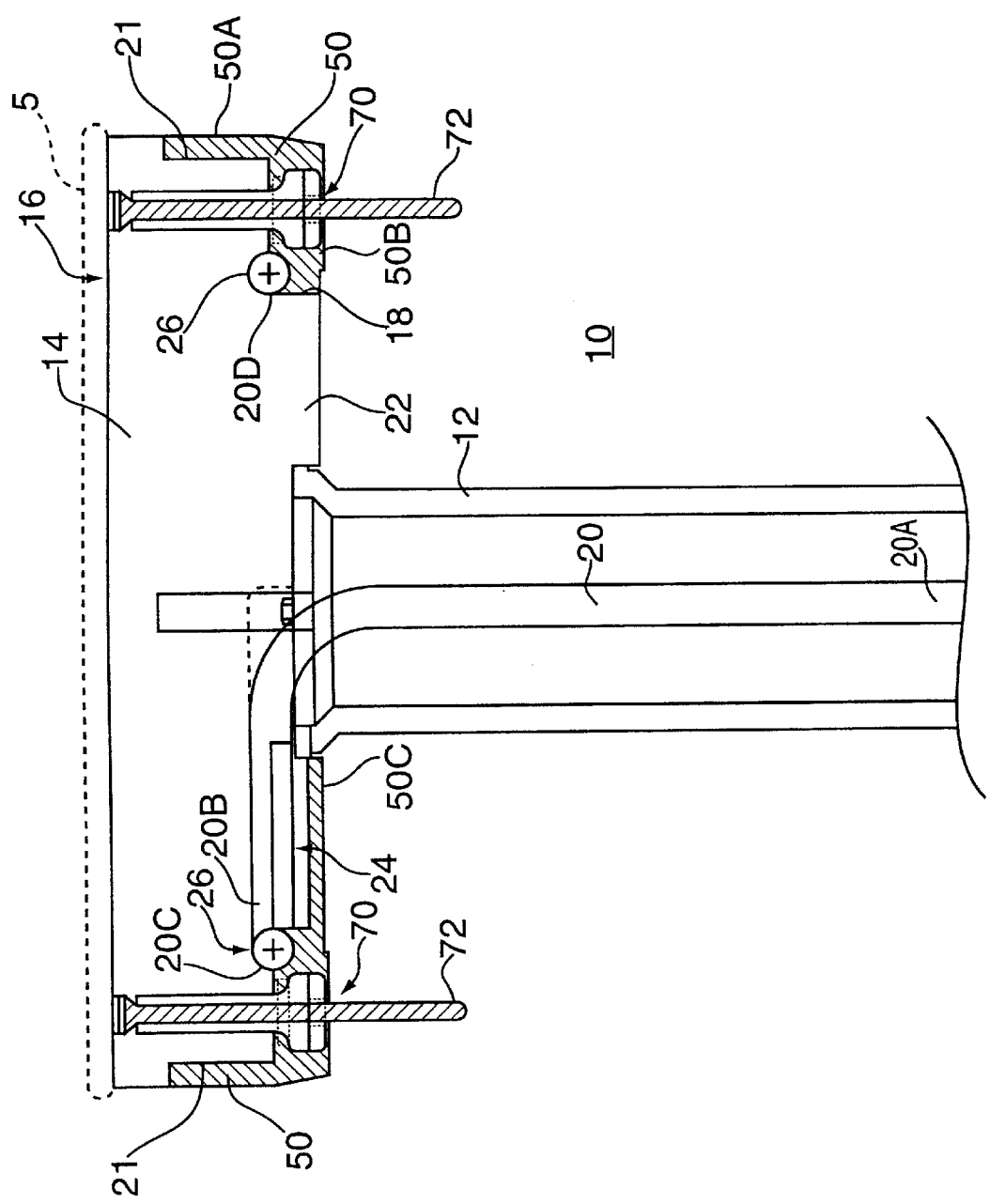
FIG. 1 depicts a cross-sectional view of a heat exchanger apparatus for use in a semiconductor wafer processing system in accordance with the present invention.
Figure 2:
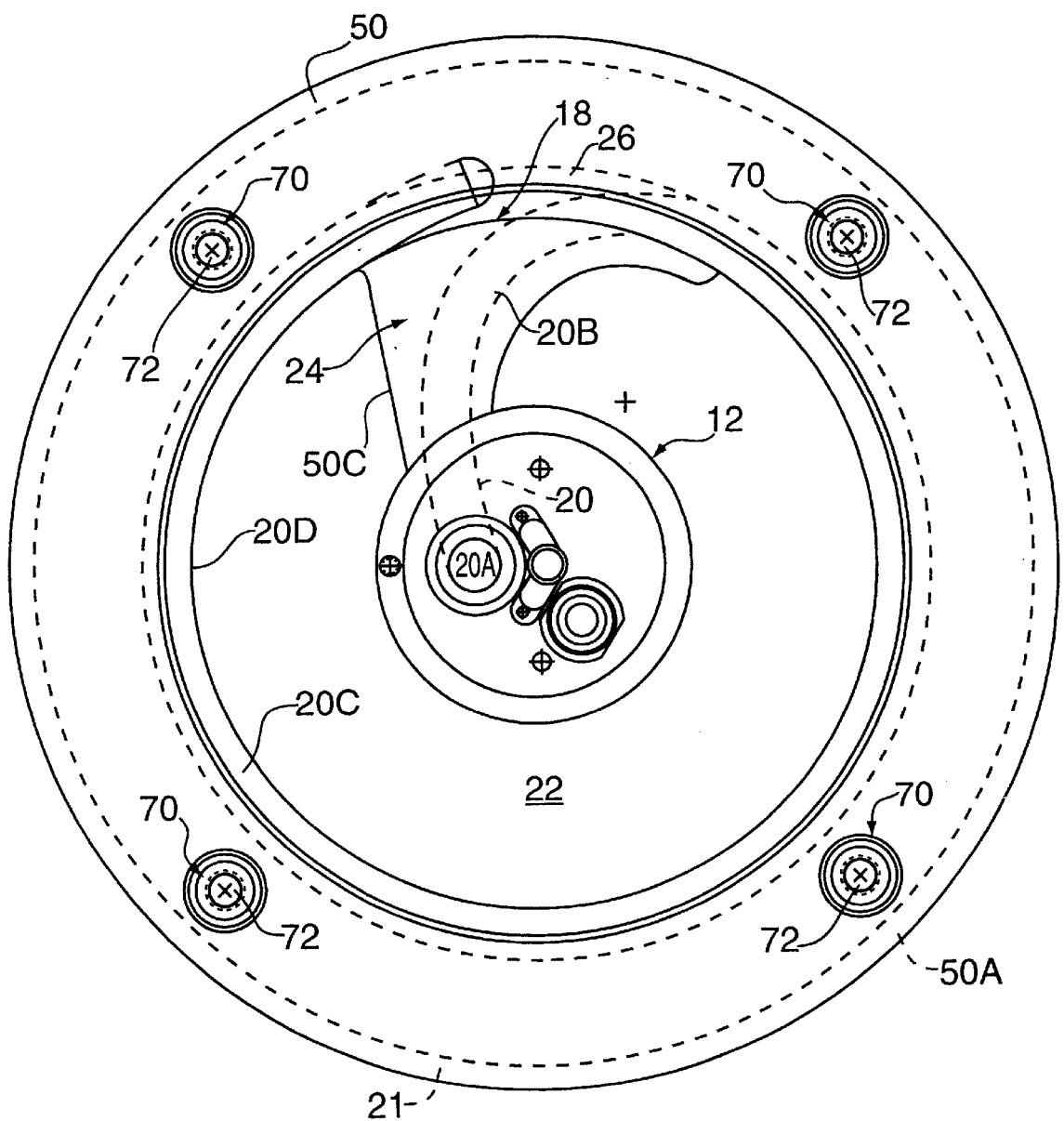
FIG. 2 depicts a bottom view of the apparatus shown in FIG. 1.

FIG. 1 depicts a side cross sectional view of a heat exchanger apparatus 10 in accordance with the present invention. FIG. 2 depicts a bottom view of the heat exchanger apparatus 10 of FIG. 1. To best understand the present invention, the reader should simultaneously refer to FIGS. 1 and 2.

Apparatus 10 includes a hollow shaft 12 and a platen 14 suitable for supporting a substrate 5, such as a semiconductor wafer, within a semiconductor wafer processing system such as chemical vapor deposition (CVD) systems, physical vapor deposition (PVD) systems, etch systems, plasma cleaning systems and the like. Platen 14 has a substrate support surface 16 on which a substrate 5 may rest during processing. A heat exchange element 20 is positioned proximate the surface 16 such that the temperature of the element 20 is substantially the same as the temperature of the surface 16. The element 20 includes a first portion 20A extending substantially the length of and in shaft 12, a second circumferential portion 20C that abuts the platen 14 and a third portion 20B that interconnects the first portion 20A with the second portion 20C. The lower portion 22 of the platen 14 includes a recessed region 24 to allow a portion 20B of the heat exchange element 20 to traverse the distance between the shaft 12 and the circular ledge 18. The circumferential portion 20C of heat exchange element 20 rests in a substantially circular depression 26 in platen 14, which is defined in part by a circular ledge 18, and allows the circumferential portion 20C of the element 20 to be positioned to couple heat to or from the surface 16 of the heat exchanger apparatus 10. The platen 14 is fabricated from a forged, plate, cast or extruded metal body (e.g., aluminum) and the various conduits, holes, depressions, recesses and channels are milled into the body. Alternatively, the platen 14 is formed of non-metallic, thermally conductive materials, i.e., a ceramic material such as aluminum-nitride.

The heat exchange element 20 is an element that can control the platen temperature, i.e., an element that heats and/or cools the platen 14. For example, the element 20 may be a resistive heater, i.e., a coil of resistive material that heats when electrical current flows through it, a fluidic heater, i.e., a tube or conduit through which a hot liquid flows, or a fluidic cooler, i.e., a tube or conduit through which a coolant flows. The element 20 generally has a cross section that is circular, but may be of any shape such as oval, square, triangular and the like. The selection of the type and shape of heat exchange element 20 is a design choice that depends upon the type of processing that will be performed by the system in which the heat exchanger apparatus is ultimately installed. The present invention ensures that the heat exchange element 20, no matter what type or shape, is maintained in thermally conductive contact with the platen 14 such that the element temperature is substantially similar to the platen temperature.

To maintain the element 20 in contact with the platen 14, a clamp member 50 circumscribes the platen 14 and the circumferential portion 20C of the heat exchange element 20. The clamp member 50 comprises a platen clamp portion 50A that circumscribes the outer surface 21 of the platen 14, a heat exchange element clamp portion 50B that maintains the element 20 within channel 26 and a depression cover portion 50C that covers the depression 24. The clamp member 50 is installed using a "shrink fit" method that is described in detail below. The heat exchange element clamp portion 50B contains holes 70 for allowing the lift pins 72 to freely move vertically through the platen 14.

Thermal coupling between the heat exchange element 20 and the platen 14 is greatly improved by providing a uniform compressive force between the circumferential portion 20C of the heat exchange element 20 and the platen 14. Element 20 is formed such that the circumferential portion 20C of the element 20 has a minimal tolerance which will allow the inner edge of the circumferential portion 20C of the element 20 to engage the ledge 18. To facilitate thermal conduction, the ledge 18 has a cross-sectional shape that approximately matches the shape of the inner surface 20D of the circumferential portion 20C of the element 20. Also, it should be recognized that the effective diameter of the heat exchange element 20 is such that an inner surface 20D of the element 20 at the interior diameter of the circumferential portion 20C is manufactured to match the diameter of the circular ledge 18.

In accordance with the present invention, the method for assembling the heat exchanger apparatus begins by placing the heat exchange element 20 adjacent to the circular ledge 18, abutting the depression 26 in the platen 14.

In order to impart a mechanical compressive force against the heat exchange element 20 in a direction against the ledge 18, the clamp member 50 is heated to a temperature that thermally expands the clamp member 50. The amount of heating required must result in an expansion of the clamp member 50 that is sufficient to slip the clamp member 50 over the outer surface 21 of the platen 14. The amount of heating will vary depending upon the type of material used to fabricate the clamp ring. The clamp member 50 is, while in the expanded state, positioned about the circumferential ledge 18 and into engagement with heat exchange element 20. Once in position, the clamp member 50 is allowed to cool and hence shrink to fit the ledge 18. Once cooled, clamp member 50 provides a uniform compressive force on the heat exchange element 20 in abutment with the depression 26 of platen 14. This compressive force improves heat transfer between element 20 and platen 14 without using any thermally conductive filler material, e.g., epoxy. Moreover, this allows the heater assembly to be used at temperatures in excess of 75% of the melting point of the platen material, i.e., there is not a thermal drop across an epoxy necessitating the use of a high temperature heat exchange element to compensate for the heat loss. As such, the element can be operated at a lower temperature than previously available and avoid damage to both the element and the platen.

Although the clamp ring 50 was heated in the foregoing description, the invention merely requires a thermal differential to be achieved between the platen 14 and the clamp ring 50. Consequently, the platen 14 could be chilled to contract its physical size and the clamp member 50 slipped over the platen 14, or the platen 14 could be chilled and the clamp ring 50 heated to achieve the thermal differential that is necessary to interfit the clamp ring 50 and platen 14.

The materials utilized in the heat exchange element 20 will generally be stainless steel or aluminum. If the heat exchange element 20 is a resistive heater, the heater may be a nickel cadmium wire that is coated with magnesium amongst other well known resistive heater materials. The platen 14 will generally be manufactured of metal such as aluminum, stainless steel or other alloys of these metals. The clamp member 50 is generally comprised of aluminum or stainless steel.

The clamp member 50 may be fabricated of a different material than the platen 14. For example, the clamp member 50 could be stainless steel and the platen 14 could be aluminum. Using a clamp member with a higher melting point, the clamp member 50 provides structural support to the platen 14. To enhance the structural support, the clamp member 50 can be cup shaped to substantially support the entire bottom surface of the platen 14 as well as provide the clamping function for the heat exchange element 20. Consequently, with the clamp member 50 providing physical support to the platen 14, the apparatus can be used at temperatures that approach the melting point of the platen material and the platen 14 will not "droop" or otherwise deform at these high temperatures.

Figure 3:
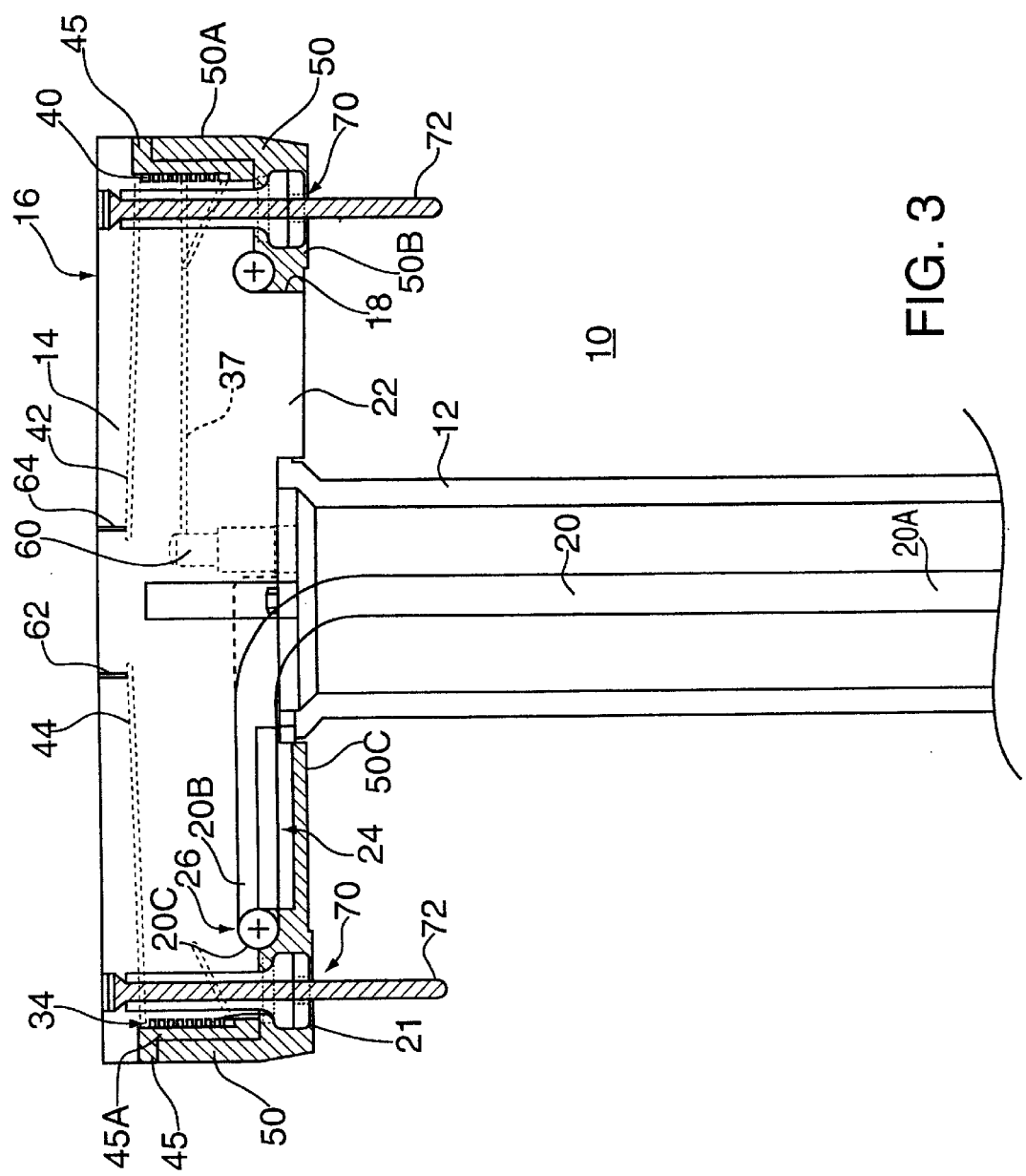
FIG. 3 depicts a cross sectional view of an alternative embodiment of the heat exchanger apparatus of the present invention.
Figure 4:
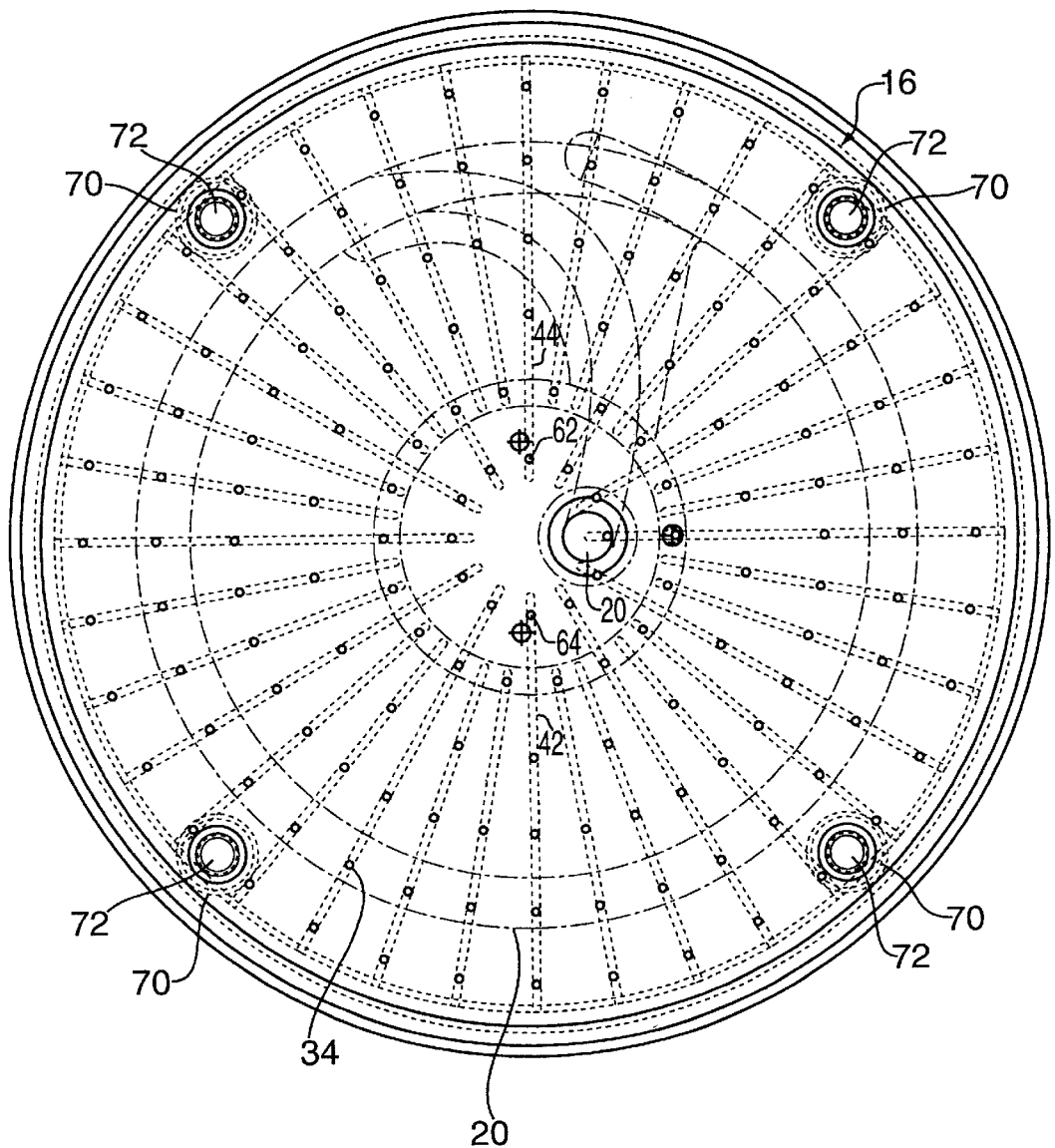
FIG. 4 is a top view of the apparatus shown in FIG. 3.

FIG. 3 depicts a cross sectional view of an alternative embodiment of the present invention and FIG. 4 depicts a top plan view of the alternative embodiment of FIG. 3. To best understand this alternative embodiment, the reader should simultaneously refer to FIGS. 3 and 4.

The alternative embodiment of FIGS. 3 and 4 adds to the first embodiment of FIGS. 1 and 2 a corkscrew conduit 34 that is used to control the temperature of a so-called "backside gas" that is supplied to the surface 16 of the platen 14, i.e., beneath the backside of a wafer. To form the conduit 34, a corkscrew channel 40 is cut into the outer surface 21 of the platen 14. A seal ring 45, having a smooth inner surface 45A, is positioned to abut the surface 21 of the platen 14 and form a cover for the channel 40 such that the corkscrew conduit 34 is formed. Of course, in an equivalent manner, the corkscrew channel could be formed in the inner surface 45A of the seal member and the surface 21 could be smooth.

The corkscrew conduit 34 is coupled to conduits 42 and 44 which connect via bores 62 and 64 that extend to the surface 16 of the platen 14. The corkscrew conduit 34 is also coupled to a heat transfer gas source (not shown) via plenum 60 and conduit 37. As such, the heat transfer gas, typically an inert gas such as helium or argon, is applied to the backside of the wafer during processing of the wafer to produce more effective thermal coupling between the wafer and the platen 14. The flow of backside gas also prevents process gases from contacting the backside of the wafer. As the gas traverses the corkscrew conduit 34, it is heated or cooled to the temperature of the platen 14. As such, the gas between the surface 16 and the wafer is substantially the same temperature as the platen 14 and the heat exchange element 20. As such, additional temperature uniformity is provided.

In order to seal the gas conduits 42 and 44 and the corkscrew conduit 34, the seal ring 45 is secured to the platen using the differential heating assembly technique that was described above. Specifically, the seal ring 45, which is generally fabricated of aluminum or stainless steel, is heated to a high temperature in order to expand its physical size and the seal ring 45 is fitted about the platen 14. When cooled, the seal ring 45 will "shrink fit" about the outer surface 21 with compressive force. It should be readily understood that the seal ring 45 is generally installed prior to application of the heat exchange element 20 in recess 18 as described above. In this alternative embodiment, the clamp member 50 is then secured about the seal member 45. All other components and assembly techniques discussed above are substantially the same.

Figure 5:
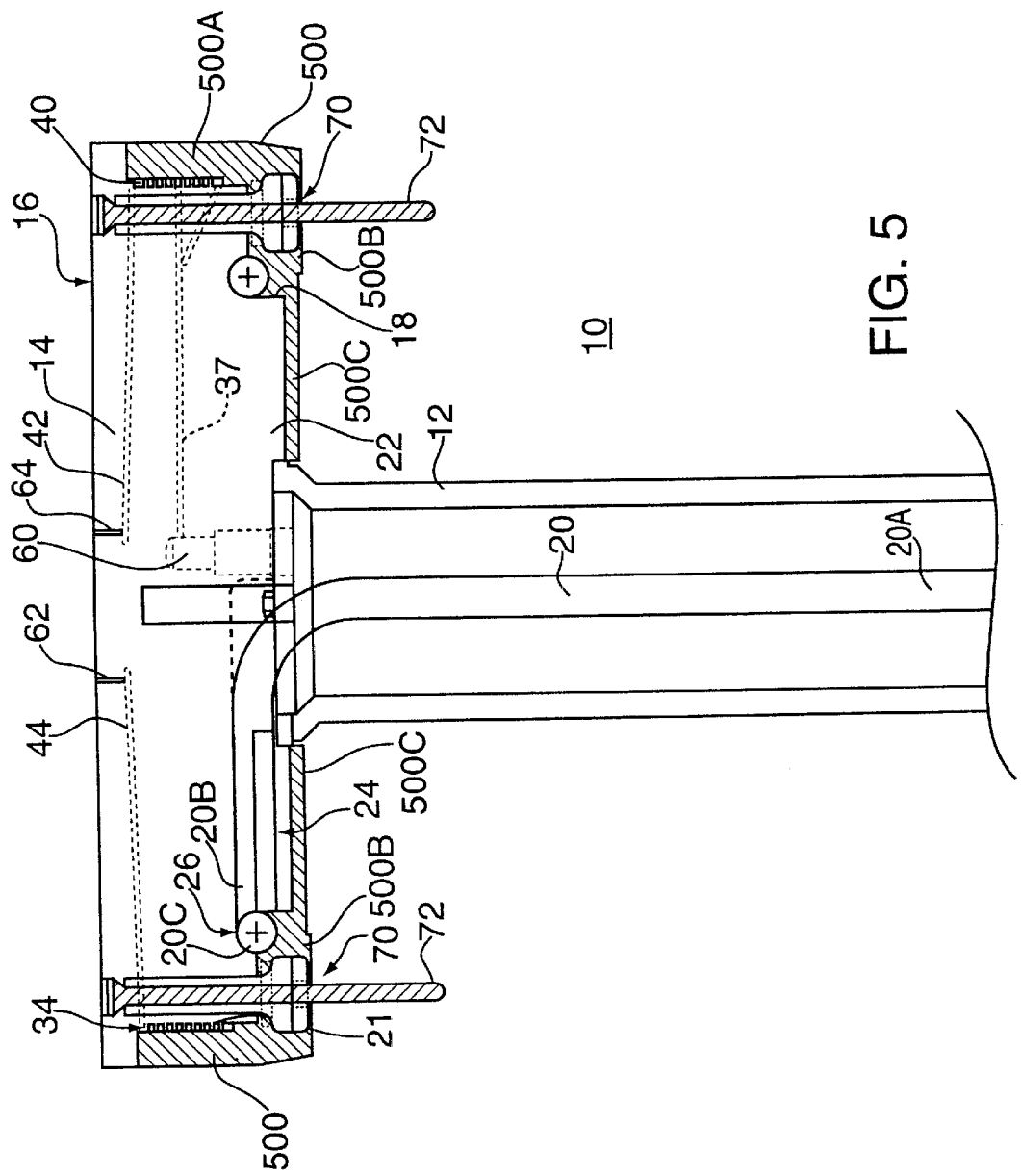
FIG. 5 is a cross sectional view of a further embodiment of the heat exchanger invention of the present invention.

FIG. 5 depicts a cross sectional view of a further embodiment of the present invention. In this embodiment, a clamp member is integrated with a seal member to form a single element, a clamp/seal member 500. The member 500 has a cylindrical portion 500A that abuts the surface 21 of the platen 14 to form the corkscrew conduit 34. The member 500, similar to member 50 of FIG. 1, also has a portion 500B that abuts the heat exchange element 20 and a portion 500C that covers the depression 26. In addition, the clamp/seal member 500 of this embodiment is depicted as being cup-shaped such that the portion 500C extends completely beneath the platen 14 and abuts the shaft 12. As such, the cup-shaped clamp/seal member supports the platen 14 to provide structural rigidity to the heat exchanger apparatus 10. As mentioned above, the clamp members of the embodiments shown in FIGS. 1 and 3 can also be adapted to extend completely beneath the platen as shown in FIG. 5. Conversely, the clamp/seal member 500 can be adapted to partially extend beneath the platen in the same manner as the clamp members of FIGS. 1 and 3.

The many features and advantages of the present invention will be apparent to one of average skill in the art. Moreover numerous modifications to the structure and method are contemplated. Each of such modifications apparent to one of average skill in the art, and all such features and advantages are intended to be within the scope of the invention as defined by the present application and the following claims.

What is claimed is:

1. A method of manufacturing a substrate support apparatus for processing a semiconductor wafer, the apparatus including a substrate support, a heat exchange element, and a clamp member, wherein the substrate support includes at least one gas conduit coupled to a corkscrew channel formed on an outer cylindrical surface of the substrate support, the corkscrew channel positioned to transfer gas from a shaft portion of the heat exchanger apparatus to the conduit, and wherein the heat exchanger apparatus further includes a seal member, comprising:

(a) mounting the heat exchange element about a portion of the substrate support, wherein the substrate support has a surface for supporting the semiconductor wafer;

(b) expanding the seal member;

(c) positioning the seal member about the corkscrew channel in the outer cylindrical surface of the substrate support;

(d) contracting the seal member about the substrate support to form a corkscrew conduit;

(e) expanding the clamp member relative to the substrate support;

(f) positioning the clamp member about a portion of the substrate support; and (g) contracting the clamp member into contact with a portion of the substrate support and the heat exchange element to maintain the heat exchange element In contact with the substrate support.

2. The method of claim 1 wherein step (b) further comprises the step of:

(b1) heating the seal member to expand the seal member relative to the substrate support.

3. The method of claim 1, wherein step (d) further comprises the step of cooling the seal member.

4. A method of manufacturing a substrate support apparatus for processing a semiconductor wafer, the apparatus including a substrate support, a heat exchange element, and a clamp member, wherein the substrate support includes at least one gas conduit coupled to a corkscrew channel formed on an outer cylindrical surface of the substrate support, the corkscrew channel positioned to transfer gas from a shaft portion of the heat exchanger apparatus to the conduit, and the portion of the substrate support about which the clamp member is positioned includes the corkscrew channel to form a corkscrew conduit, comprising:

(a) mounting the heat exchange element about a portion of the substrate support, wherein the substrate support has a surface for supporting the semiconductor wafer;

(b) expanding the clamp member relative to the substrate support;

(c) positioning the clamp member about a portion of the substrate support; and (d) contracting the clamp member into contact with a portion of the substrate support and the heat exchange element to maintain the heat exchange element in contact with the substrate support.

5. The method of claim 1 wherein the clamp member is fabricated of stainless steel and the substrate support is fabricated of aluminum.

6. A method of manufacturing a wafer heater assembly comprising the steps of:

(a) providing a heater element within a channel formed in a wafer platen;

(b) heating a clamp member to expand the clamp member to a size that enables the clamp member to circumscribe the platen;

(c) placing the clamp member about a portion of the heater element and a portion of the platen; and (d) cooling the clamp member to retain the heater element in the channel of the platen.

7. The method of claim 6 wherein the platen includes at least one gas conduit coupled to a corkscrew channel formed on an outer cylindrical surface of the platen, the channel positioned to transfer gas from a shaft portion of the heater assembly to the conduit, and wherein the heater assembly further includes a seal member, the method further including the steps, after said step (a) and prior to step (b), of:

(a1) heating the seal member to expand the seal member;

(a2) positioning the seal member about the corkscrew channel; and (a3) cooling the seal member to affix the seal member about the corkscrew channel and form a corkscrew conduit.

8. The method of claim 7 wherein the platen includes at least one gas conduit coupled to a corkscrew channel formed on an outer cylindrical surface of the platen, the corkscrew channel positioned to transfer gas from a shaft portion of the heater or exchanger assembly to the conduit, and the portion of the platen about which the clamp member is positioned includes the corkscrew channel to form a corkscrew conduit.

* * * * *